United States Patent
Yamakawa

[11] Patent Number: 5,929,432
[45] Date of Patent: Jul. 27, 1999

[54] SOLID STATE IMAGE SENSING DEVICE AND IMAGE SENSOR USING THE SAME

[75] Inventor: Kazuaki Yamakawa, Kawasaki, Japan

[73] Assignee: Kabushiki Kaisha Toshiba, Kawasaki, Japan

[21] Appl. No.: 08/865,100

[22] Filed: May 29, 1997

[30] Foreign Application Priority Data

May 30, 1996 [JP] Japan ................................. 8-136785

[51] Int. Cl.$^6$ ..................................................... H01J 40/14
[52] U.S. Cl. ........................ 250/208.1; 250/226; 358/514
[58] Field of Search ............................ 250/226, 208.1, 250/216; 358/514, 575; 257/440, 446

[56] References Cited

U.S. PATENT DOCUMENTS 5,453,611  9/1995  Oozu et al. ............................ 250/208.1
5,648,653  7/1997  Sakamoto et al. .................... 250/208.1

FOREIGN PATENT DOCUMENTS 60-053922  3/1985  Japan .
63-167577  7/1988  Japan .
 07203126  8/1995  Japan .

*Primary Examiner*—Stephone Allen
*Attorney, Agent, or Firm*—Finnegan, Henderson, Farabow, Garrett & Dunner, L.L.P.

[57] ABSTRACT

In this solid-state image sensing device, pixel sensors for detecting ordinary color image and a pixel sensor for detecting infrared rays recorded as invisible information are formed on the same substrate. A near-infrared ray transmission filter for detection of near-infrared rays is formed with a stacked body of red filter and blue filter. This solid image sensing device can be applied to both the linear sensor and the area sensor. In addition, there is also provided an image sensor in which the light source, the optical system and the scanning system are combined with such a solid-state image sensing device.

18 Claims, 7 Drawing Sheets

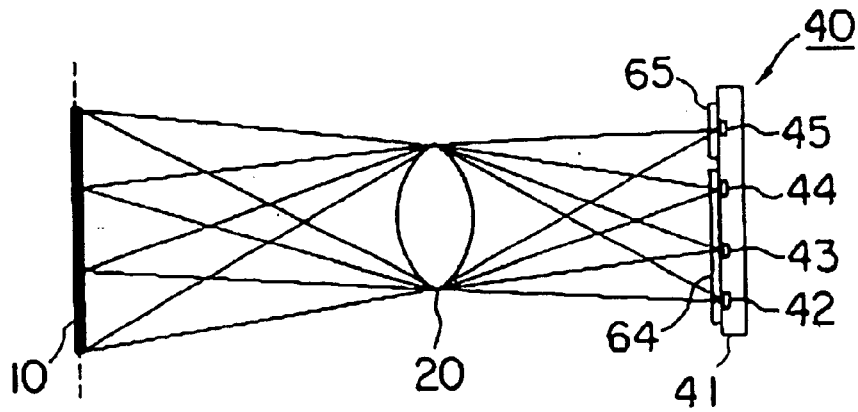
F I G. 1
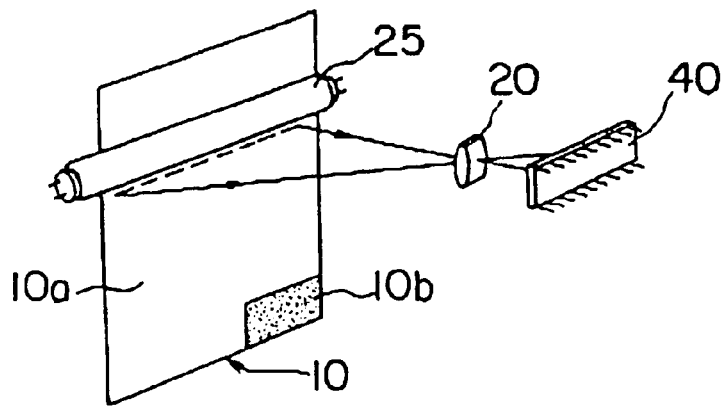
F I G. 2
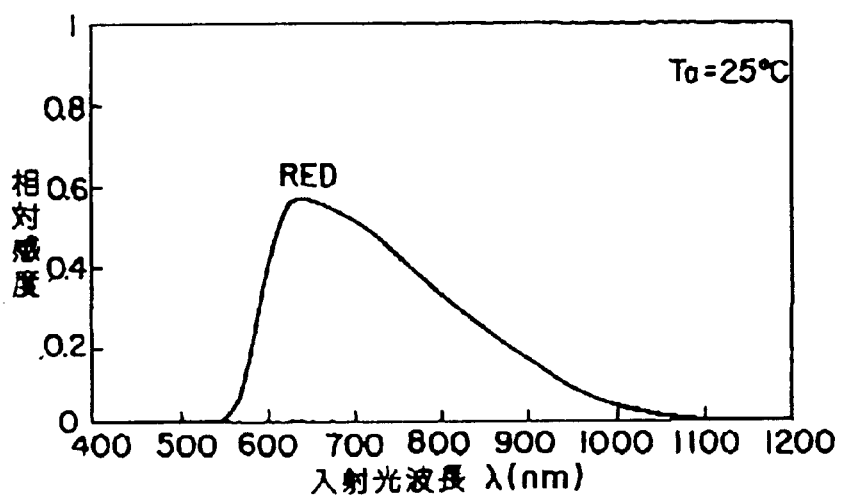
F I G. 4

| | | | | | | | |
|---|---|---|---|---|---|---|---|
| G | Mg | G | Mg | G | Mg | G | Mg |
| Cy | R/B | Cy | Ye | Cy | R/B | Cy | Ye |
| G | Mg | G | Mg | G | Mg | G | Mg |
| Cy | Ye | Cy | R/B | Cy | Ye | Cy | R/B |
| G | Mg | G | Mg | G | Mg | G | Mg |
| Cy | R/B | Cy | Ye | Cy | R/B | Cy | Ye |

SOLID STATE IMAGE SENSING DEVICE AND IMAGE SENSOR USING THE SAME

BACKGROUND OF THE INVENTION

This invention relates to improvements in a solid state image sensing device capable of reading invisible information recorded in the near-infrared region, and an image sensor adapted for reading object such as manuscripts or securities, etc. to obtain picture signals, and more particularly to an image sensor capable of reading invisible information recorded in the near-infrared region as well.

An example of a conventional typical image sensor will now be described with reference to FIG. 12. In this figure, a reflected light from an object 10 to be read such as manuscript, etc. is introduced through a lens 20 of the optical system and a filter 30 for cutting infrared rays, and light image is thus projected onto a solid state image sensing device 40. This solid state image sensing device 40 is a CCD, etc. for converting light image into picture signals. In addition, the infrared ray cut filter 30 serves to cut off rays of light (electromagnetic wave) of long wavelength to prevent lowering of the resolution resulting from the lens performance.

FIG. 13 shows the spectral sensitivity characteristic of the solid state image sensing device 40. In this figure, the abscissa indicates wavelength of incident light to the solid state image sensing device, and the ordinate indicates relative sensitivity when the maximum sensitivity is assumed to be reference value 1. The human eyes can sense electromagnetic wave of wavelength of approximately 380 nm (violet)–780 nm (red) to recognize it as visible light, but cannot recognize electromagnetic wave of wavelength except for this range (ultraviolet rays, infrared rays). However, the solid state image sensing device (CCD) has sensitivity also in the near-infrared region of 800–1000 nm which is invisible to the human being.

FIG. 14 shows transmission characteristics of color compensation filters which are one of the infrared ray cut filters. In this figure, the abscissa indicates wavelength of light, and the ordinate indicates transmissivity of light. CC-500 to CM-500 in this figure represent kind of filters. In the case where, e.g., the filter of CM-500 is used in the solid state image sensing device (CCD) shown in FIG. 12, incident light having wavelength of 600 nm is attenuated by 50%. Incident light of 600 nm is greatly attenuated, and most part of incident light of 700 nm is cut.

FIG. 15 shows an example of heat ray absorption filters which are different kind of the infrared ray cut filter. In this figure, the abscissa indicates wavelength of light and the ordinate indicates transmissivity of light. HA-20 to HA-60 in the figure represent kind of filters. In the case where, e.g., the filter of HA-20 is used in the solid state image sensing device (CCD) shown in FIG. 12, incident light having wavelength of 620 nm is attenuated by 50%. With respect to incident light of 800 nm, the transmissivity becomes equal to 10%. Namely, most part of the incident light of 800 nm is cut.

The image sensors are used for reading various papers (sheets) or the like. Among these papers, there are securities and/or certificates, etc. adapted so that, in order to give false prevention function or special information, when infrared rays are irradiated thereto, specific mark or information can be read out.

However, with the device using the infrared ray cut filter as described above, it is impossible to read marks or characters, etc. recorded in the near-infrared region.

FIG. 16 shows an example of trial manufacture of an image sensor adapted to have ability of reading characters, etc. recorded in the infrared region. In this figure, light obtained from object 10 to be read is branched into two rays of light by a half mirror 21. One ray is converged onto solid state image sensing device 40 provided with three CCD photosensitive pixel line sensors 42, 43, 44 corresponding to red, green and blue via lens 20 and infrared ray cut filter 30. In addition, the other light ray separated by the half mirror 21 is converged onto a solid state image sensing device 50 having a photosensitive pixel line sensor 45 for reading light in the infrared region as it is by a lens 22.

The solid state image sensing device 40 is adapted so that the three CCD line sensors 42, 43, 44 are formed on the substrate surface thereof. The first line sensor 42, the second line sensor 43 and the third line sensor 44 have configurations in which red filter, green filter and blue filter are respectively formed on the photosensitive pixel trains, and adapted for respectively reading the red component, the green component and the blue component.

The infrared ray cut filter 30 serves to cut infrared rays. Since employment of the infrared ray cut filter 30 results in improvement in convergence of light of the optical system, the solid state image sensing device 40 reads the object with a satisfactory resolution to output three color picture signals of R, G, B.

Moreover, in the solid state image sensing device 50, one line sensor is formed on the substrate. A filter (not shown) which allows light in the near-infrared region to be transmitted therethrough is formed on this line sensor to read marks or characters, etc. recorded in the near-infrared region. The result obtained by reading is outputted, e.g., as monochromatic picture signal of white and black.

However, with such configuration, the optical system for branching the optical path is complicated. As a result, the image sensor becomes large-sized and it is also difficult to carry out assembling with high accuracy. In addition, there is the problem that there results increased cost because plural solid state image sensing devices are required.

In order to solve such problem, an image sensor comprising both three color sensors and an infrared sensor on one chip is disclosed, e.g., in the Japanese Patent Application Laid-Open Publication No. 7-213126(1995). However, since there is employed the complicated structure in which the infrared ray cut filter is separately provided on the surface of the hermetically sealed package, satisfactory improvement cannot be made with respect to difficulty in manufacture and/or assembling accuracy.

In addition, an image sensor system in which infrared ray cut filter and infrared ray transmission filter are formed on the solid state image sensing device is disclosed in the Japanese Patent Application Laid-Open Publication No. 60-53922(1985). However, since filters of materials different from material of color filters are used as respective filters, there still remained problems in respect of the accuracy and the cost.

SUMMARY OF THE INVENTION

An object of this invention is to provide a solid state image sensing device and an image sensor using the same which are capable of reading marks or characters, etc. recorded in the near-infrared region and can be manufactured with good accuracy.

To achieve the above-mentioned object, in accordance with the first aspect of this invention, there is provided a solid state image sensing device comprising:

first to fourth pixel sensors formed substantially in a parallel row form on a semiconductor substrate surface portion and adapted for generating signals corresponding to quantities of received rays of light;

color filters of red, green and blue respectively formed on the rows of the first to third pixel sensors;

an infrared ray cut filter for commonly covering the color filters of red, green and blue; and a near-infrared ray transmission filter comprised of a stacked body of the color filters of red and blue formed on the row of the fourth pixel sensor.

In accordance with this solid state image sensing device, since the sensors for taking out three primary colors and the near-infrared ray detection sensor for reading concealed or secret information invisible to the eye such as marks and/or characters, etc. recorded in the near-infrared region are provided on the same semiconductor substrate, and particularly the near-infrared ray transmission filter which was separately required is caused to be stacked body of filters of three primary colors, the optical distance is reduced. Thus, miniaturization of the entirety of the device and reduction in cost become easy.

In accordance with the second aspect of this invention, there is provided a solid state image sensing device comprising:

plural pixel sensors formed in a matrix form on a semiconductor substrate surface portion and adapted for generating signals corresponding to quantities of received rays of light; and near-infrared ray transmission filters each comprised of a stacked body of color filters of red and blue, which are formed on specific ones of the pixel sensors arranged in a distributed manner in accordance with a predetermined rule among the plural pixel sensors.

In this solid state image sensing device, since a portion of the pixel sensors of the area sensor is caused to serve as the near infrared ray detection sensor, an image sensor capable of reading invisible information as well can be realized with simple configuration. In addition, miniaturization and/or reduced cost of the device can be also attained.

In accordance with the third aspect of this invention, there is provided an image sensor comprising:

a light source for irradiating light onto a manuscript to be read partially including an area from which near-infrared rays are emitted;

an optical system for converging a reflected light obtained as the result of the fact that the light irradiated from the light source is reflected on the surface of the manuscript;

a scanning system for carrying out relative movement between the optical system and the manuscript; and a solid state image sensing device adapted for receiving the reflected light converged by the optical system, the solid state image sensing device including first to fourth pixel sensors formed substantially in a parallel row form on a semiconductor substrate surface portion and adapted for generating signals corresponding to quantities of received rays of light, color filters of red, green and blue respectively formed on the rows of the first to third pixel sensors, an infrared ray cut filter for commonly covering the color filters of red, green and blue, and a near-infrared ray transmission filter comprised of a stacked body of the color filters of red and blue formed on the row of the fourth pixel sensor.

In accordance with the fourth aspect of this invention, there is provided an image sensor comprising:

a light source for irradiating light onto a manuscript to be read at least partially including an area from which near infrared rays are emitted;

an optical system for converging a reflected light obtained as the result of the fact that the light irradiated from the light source is reflected on the surface of the manuscript; and a solid state image sensing device adapted for receiving the reflected light converged by the optical system, the solid state image sensing device including plural pixel sensors formed in a matrix form on a semiconductor substrate surface portion and adapted for generating signals corresponding to quantities of received rays of light, and near-infrared ray transmission filters each comprised of a stacked body of color filters of red and blue, which are formed on specific ones of the pixel sensors arranged in a distributed manner in accordance with a predetermined rule among the plural pixel sensors.

In accordance with the fifth aspect of this invention, there is provided an image sensor comprising:

a light source for irradiating light onto a manuscript to be read partially including an area from which near infrared rays are emitted;

an optical system for converging a reflected light obtained as the result of the fact that the light irradiated from the light source is reflected on the surface of the manuscript and for separating it into rays of light in first to third optical paths; and first to third solid state image sensing devices respectively provided on first to third optical paths, the first to third solid state image sensing devices respectively including plural pixel sensors formed in a matrix form a the semiconductor substrate surface portion and adapted for generating signals corresponding to quantities of received rays of light, at least one of the first to third solid state image sensing devices including near-infrared ray transmission filters each comprised of a stacked body of color filters of red and blue, which are formed on specific ones of the pixel sensors arranged in a distributed manner in accordance with a predetermined rule among the plural pixel sensors.

In accordance with these image sensors, since the solid state image sensing device in which the near-infrared ray transmission filter formed by the stacked body of color filters of red and blue is provided and the sensors for ordinary image reading and the sensor for the near-infrared ray detection are formed on the same substrate is used to carry out reading operation, a compact and low cost image sensor capable of reading information on manuscripts from which near infrared rays are emitted can be provided.

BRIEF DESCRIPTION OF THE DRAWINGS

FIG. 1 is a model view showing the configuration when viewed from the optical system of an image sensor according to this invention.

FIG. 2 is a perspective view showing outline of the configuration of the image sensor according to this invention.

FIG. 4 is a characteristic curve showing an example of the spectral sensitivity curve of the solid state image sensing device in which red filter is caused to be in on chip state.

DETAILED DESCRIPTION OF THE PREFERRED EMBODIMENTS

Preferred embodiments of this invention will now be described with reference to the attached drawings.

Figure 12:
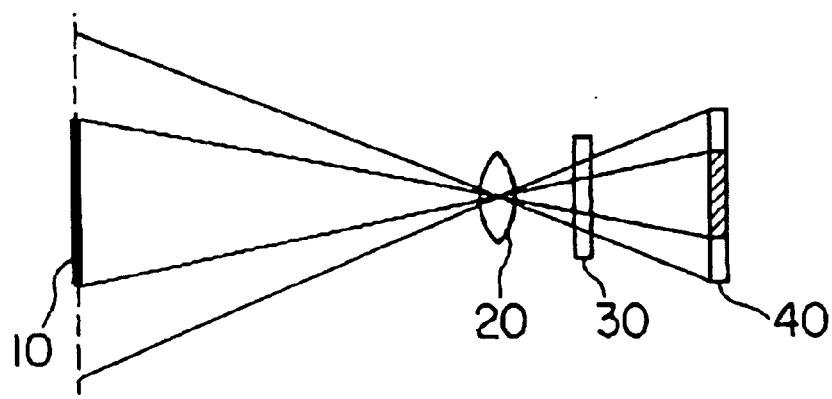
FIG. 12 is a model view for explaining an example of a conventional image sensor.
Figure 13:
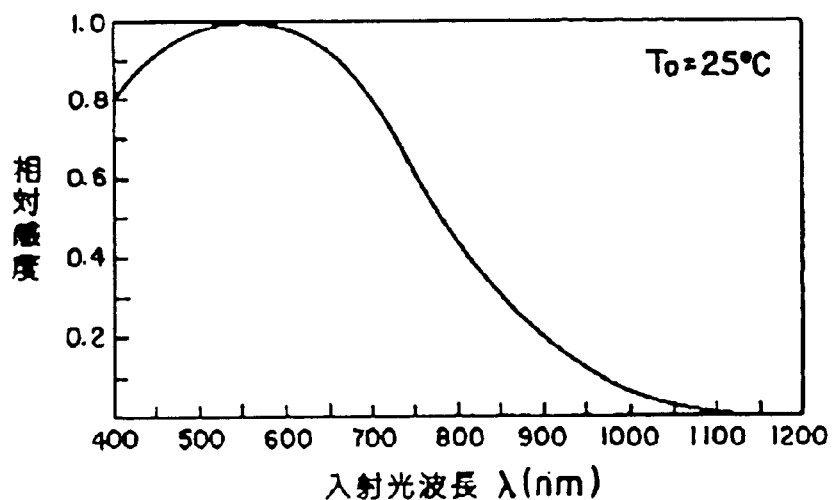
FIG. 13 is a characteristic curve showing an example of the spectral sensitivity characteristic of solid state image sensing device (CCD).
Figure 14:
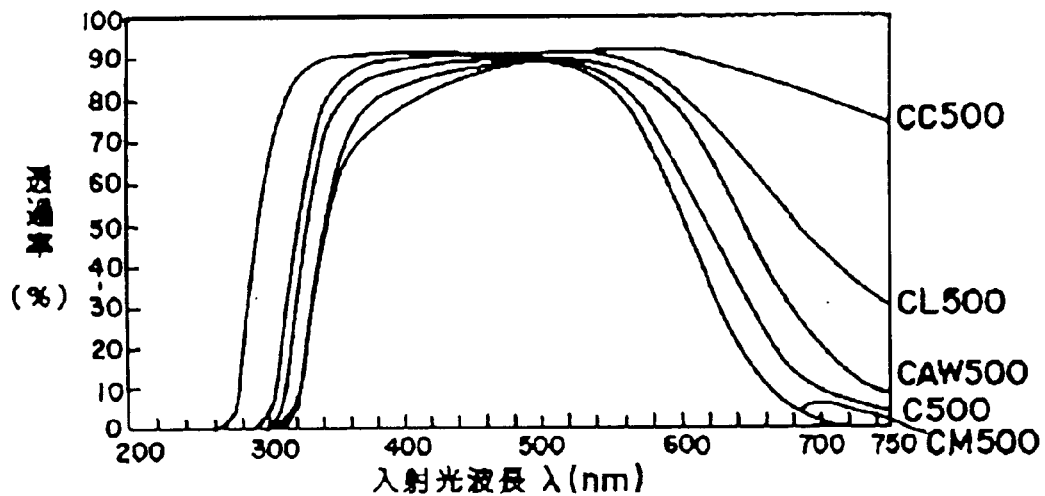
FIG. 14 is a characteristic curve showing an example of transmission characteristic of infrared ray cut filter by various color compensation filters.
Figure 15:
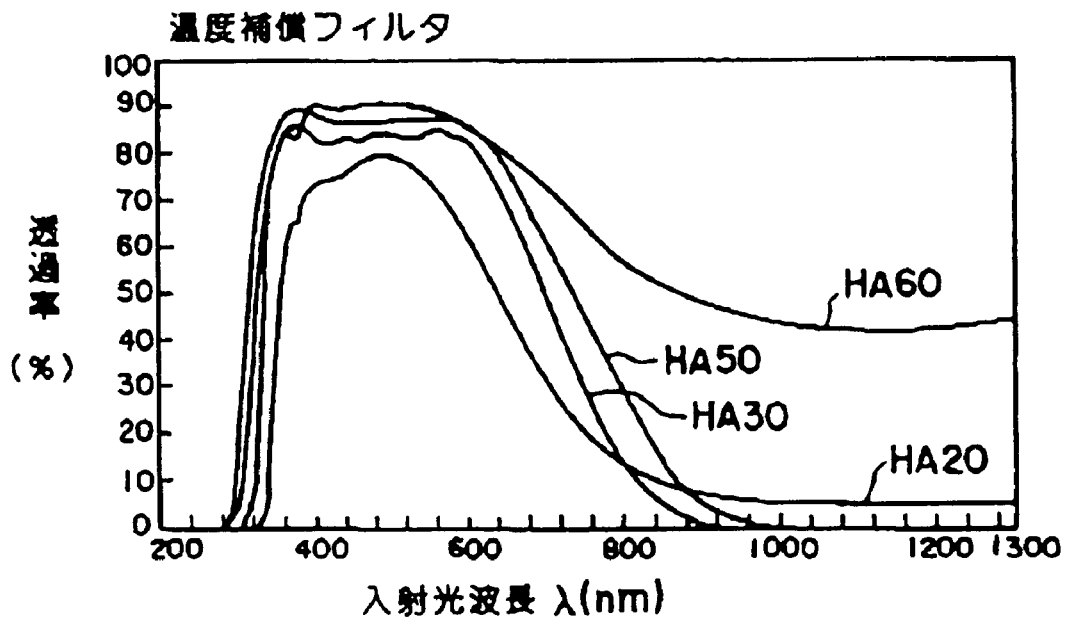
FIG. 15 is a characteristic curve showing an example of transmission characteristic of infrared ray cut filter by heat ray absorption filters.
Figure 16:
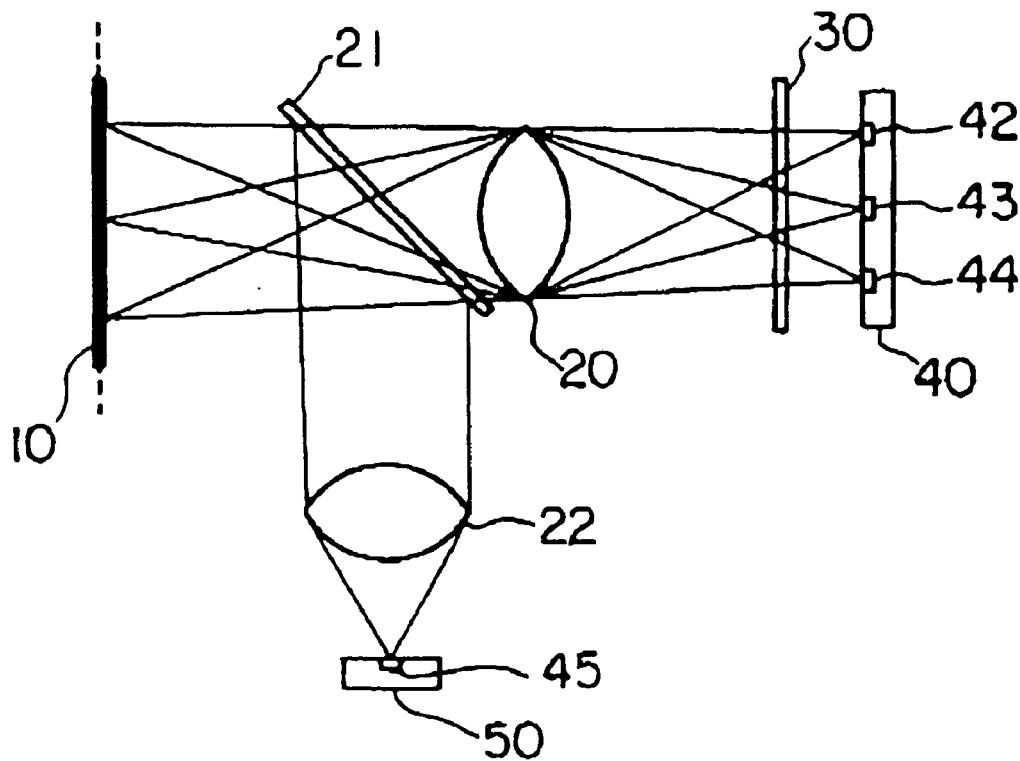
FIG. 16 is an explanatory view showing an example manufactured in trial.

FIG. 1 is a view showing outline of the configuration in which optical paths between respective main components in an image sensor according to a first embodiment of this invention are mainly indicated. FIG. 2 is a schematic perspective view showing spatial positional relationship between respective main components in correspondence with FIG. 1. In these figures, the same reference numerals are respectively attached to the portions corresponding to those of FIG. 12, and explanation of these portions will be omitted.

As shown in FIG. 2, on manuscript 10 to be read, visible characters, etc. are described in a first area 10a which occupies the greater part thereof, and characters or marks, etc. recorded by recording material in the near-infrared region are described in a second area 10b provided at the end portion thereof.

Light is irradiated onto the object 10 to be read by a light source 25, and a reflected light from the surface of the object 10 to be read is guided into solid state image sensing device 40 which is line sensor by the optical system including lens 20, etc.

Referring to FIG. 1, the state where reflected light from the object 10 to be read is converged into respective photosensitive pixel portions 42, 43, 44, 45 of the solid state image sensing device 40 by the lens 20 is shown. This solid state image sensing device 40 comprises, on the surface of a substrate 41, an infrared ray cut filter 64 and a near-infrared ray transmission filter 65.

Figure 3:
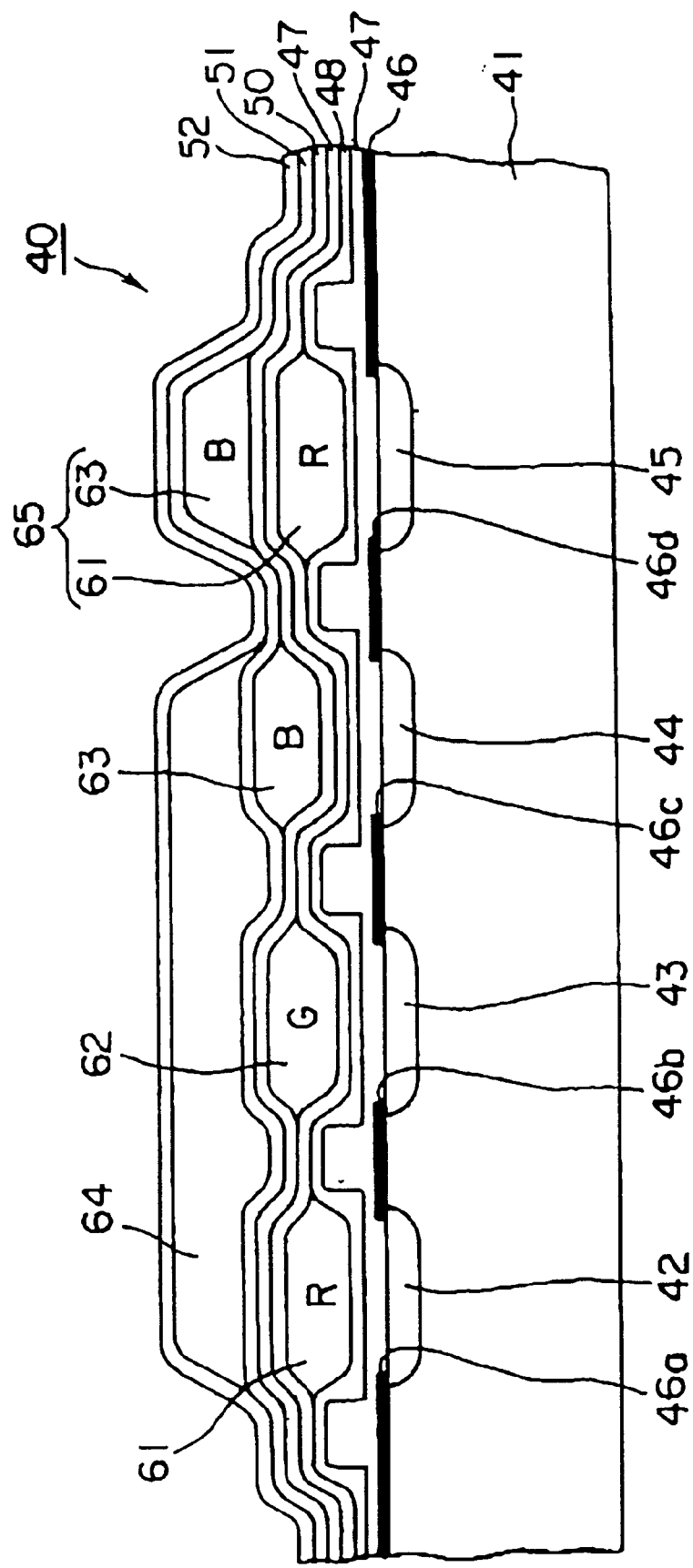
FIG. 3 is a device cross sectional view showing the configuration of a solid state image sensing device according to this invention.

FIG. 3 is a cross sectional view showing the detailed structure of the solid state image sensing device 40, wherein the state cut in a direction perpendicular to the line of the line sensor is shown.

At the surface portion of the semiconductor substrate 41, four photosensitive pixel portions 42, 43, 44, 45 are disposed in parallel at substantially fixed intervals (spacings), and these portions serve to detect rays of light in red, green, blue and near-infrared regions as described later. In addition, plural photosensitive pixel portions are formed in a direction perpendicular to paper (surface) so that the line sensor is constituted.

On the surface of the semiconductor substrate 41, a light shielding film 46 comprised of aluminum is formed in a manner to provide opening portions 46a, 46b, 46c, 46d corresponding to the photosensitive pixel portions 42, 43, 44, 45. At the upper portion of such configuration, polyglycidyl methacrylate (PGMA) films 48–52 which are intermediate protective films and filters 61–64 are alternately stacked on a silicon oxide film 47 having recessed portions corresponding to the opening portions. These filters 61–64 are dyed by mixing dyes corresponding to desired colors into gelatin or casein.

As apparent from FIG. 3, the infrared ray cut filter 64 for commonly covering the photosensitive pixel portions corresponding to red, green and blue is formed thereabove, and the red filter 61 and the blue filter 63 are formed above the photosensitive pixel portion 45 for near-infrared region. As described later, the stacked body of the red filter 61 and the blue filter 63 functions as a near-infrared ray transmission filter 65. In addition, the infrared ray cut filter 64 serves to cut rays of light of (electromagnetic wave) of long wavelength to prevent lowering of resolution resulting from the lens performance.

It is to be noted that the red filter 61 and the blue filter 63 constituting the near-infrared transmission filter 65 are respectively formed at the same process steps as those of the red filter 61 and the blue filter 63 formed on the photosensitive pixels 42 and 44.

Figure 5:
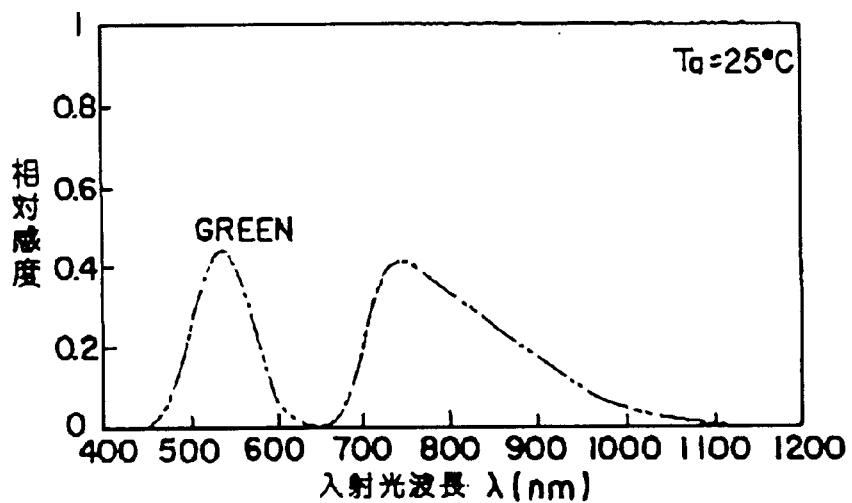
FIG. 5 is a characteristic curve showing an example of the spectral sensitivity curve of the solid state image sensing device in which green filter is caused to be in on chip state.
Figure 6:
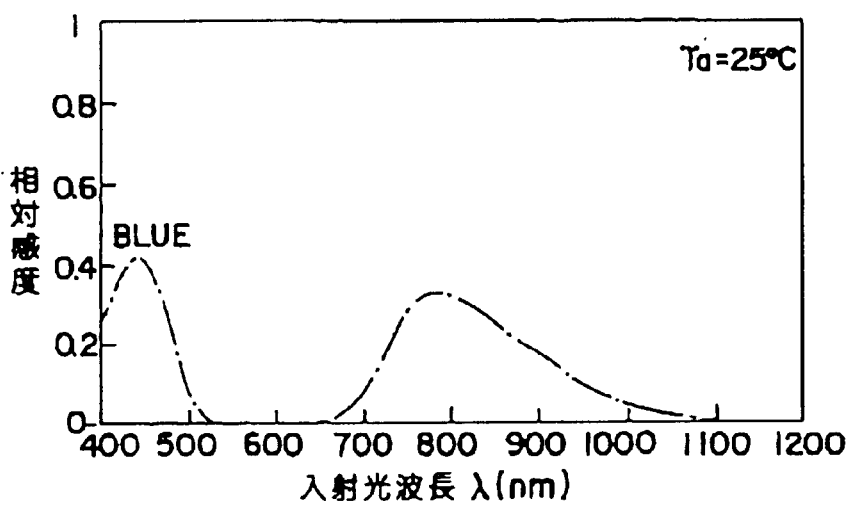
FIG. 6 is a characteristic curve showing an example of the spectral sensitivity curve of the solid state image sensing device in which blue filter is caused to be in on chip state.

FIGS. 4–6 are characteristic curves showing the relationship between incident light wavelength and relative sensitivity of photosensitive pixels respectively having the red filter 61, the green filter 62 and the blue filter 63. It is seen that these sensors (filters) have peak sensitivity in the wavelength regions corresponding to respective colors.

Figure 7:
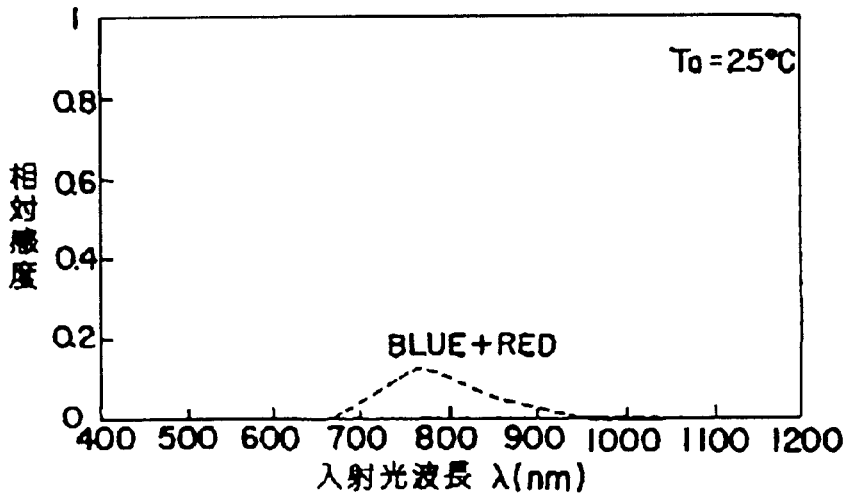
FIG. 7 is a characteristic curve showing an example of spectral sensitivity curve of the solid state image sensing device in which near-infrared ray transmission filter (red+ blue filters) is caused to be in on chip state.

FIG. 7 is a characteristic curve showing the relationship between incident light wavelength and relative sensitivity of the photosensitive pixel having stacked structure of the read filter 61 and the blue filter 63. In this case, it is seen that the sensor comprised of this photosensitive pixel structure with filter has a peak of sensitivity in the vicinity of 800 nm which is the near-infrared ray region, and functions as a near-infrared ray transmission filter.

The operation of the image sensor including such solid state image sensing device will now be described.

Referring to FIGS. 1 and 2, the object 10 to be read and the solid state image sensing device 40 are caused to undergo relative movement in the sub scanning direction perpendicular to the main scanning direction which is the direction of the line sensor. Thus, red, green and blue components of picture images are respectively outputted from line sensors 42, 43, 44. During scanning of manuscript surface where no recording is carried out in the near-infrared region, any output is not provided from the line sensor 45.

When the area 10b of the manuscript is reached, the fourth line sensor 45 detects near-infrared rays, whereby recorded information is read out as a picture signal. The picture signal thus read out is processed by computer system (not shown). Thus, characters or marks are interpreted by various pattern recognition or OCR technologies.

In this case, the relative movement system between the object 10 to be read and the solid state image sensing device 40 described here is roughly classified into the system in which the solid state image sensing device 40 is fixed to move the manuscript 10 which is object to be read and the system in which the manuscript 10 which is object to be read is fixed to move light source, lens and solid state image sensing device, etc. The former system is employed in facsimile, and the latter system is employed in the so-called flat bed scanner or copy machine. This invention can be applicable to both systems.

As stated above, in the solid state image sensing device according to this invention, since the near-infrared ray transmission filter is obtained by stacking plural color filters, it is possible to form near-infrared ray transmission filter with good accuracy by the same process as that of the color filters.

Figures 8, 9:
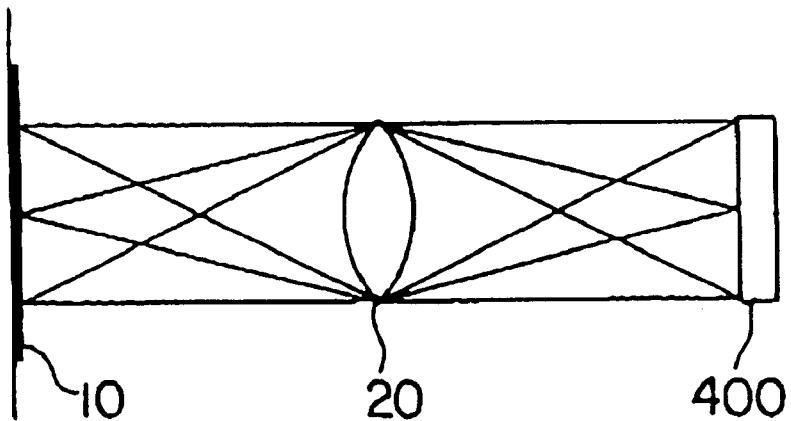
FIG. 8 is an explanatory view showing another embodiment of this invention using filter of complementary color system.
FIG. 9 is an explanatory view showing an example of arrangement of color filter in area image sensor (single element type).

FIG. 8 shows another embodiment of this invention, wherein an area sensor 400 is used in place of line sensor 40 of FIG. 1.

This area sensor 400 is constituted by color CCD in which pixel sensors constituting unit pixels are two-dimensionally arranged to form color filters on the surfaces of the pixel sensors. In this area sensor, in order to obtain three color signals, as shown in FIG. 9, there is employed a filter configuration in which filters of green (G), cyan (Cy), magenta (Mg) and yellow (Ye) of the complementary color system are used, and filters of yellow (Ye) or magenta (Mg) are replaced by near-infrared ray transmission filters in the ratio of, e.g, three-four (3-4) to one (in the 3-4:1 ratio). This near-infrared ray transmission filter is obtained by stacking the red filter (R) and the blue filter (B).

In such area sensor, color information corresponding one pixel is extracted by four sensors in which respective two sensors are arranged in length and breadth directions. Color information are obtained every respective pixels. Thus, a color picture signal is formed. In addition, near-infrared information can be obtained from the photosensitive pixels immediately below the near-infrared ray transmission filters.

Namely, since arrangement of respective color filters on the CCD array is recognized in advance, it is possible to discriminate between levels of respective color pixels of a picture signal which is read out in synchronism with a clock signal. Thus, it is possible to collect picture information collected by the near-infrared sensors. In addition, pixels of yellow (Ye) which have been missing (decreased) as the result of the fact that the near-infrared ray transmission filters (R/B) are inserted can be compensated by the compensation technology utilizing the correlation between picture information, e.g., the so-called inter-line insertion or inter-frame insertion, etc.

By using such area sensor in the image sensor, it becomes possible to read concealed (hidden) information recorded by recording material in the near-infrared region while maintaining the level equivalent to the conventional picture quality.

Figure 10:
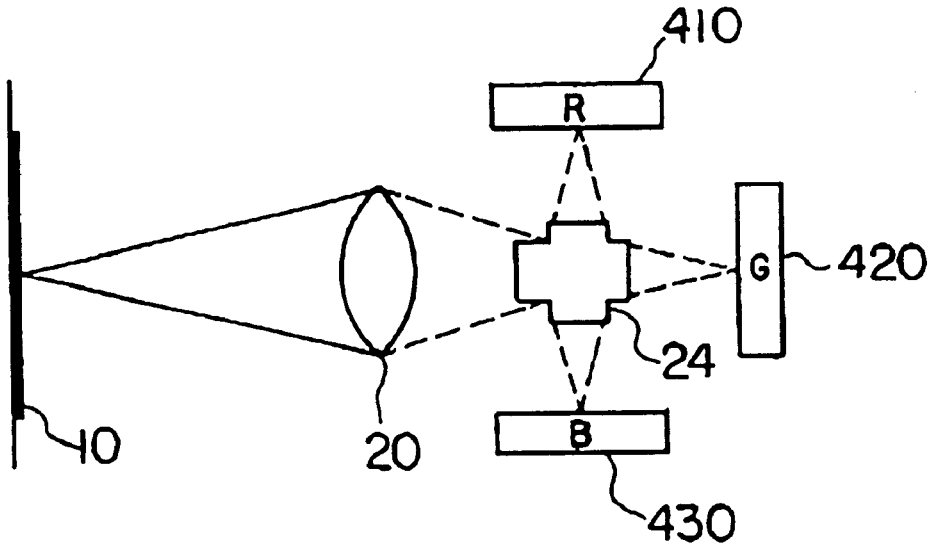
FIG. 10 is an explanatory view showing a further embodiment (three element type area image sensor) of this invention.

FIG. 10 shows a further embodiment. While the technology of the CCD camera of the so-called single sensor type can be utilized in the example of FIG. 8, the technology of the CCD camera of the so-called three sensor type can be utilized in the example of FIG. 10.

In this figure, reference numeral 10 denotes object to be read, reference numeral 20 denotes lens, reference numeral 24 denotes a prism, reference numeral 410 denotes a CCD area sensor adapted for outputting red (R) signal, reference numeral 420 denotes a CCD area sensor adapted for outputting green (G) signal, and reference numeral 430 denotes a CCD area sensor adapted for outputting blue (B) signal. By using the three color decomposition prism, monochromic CCD (CCD for white and black) may be used for respective area sensors. It is a matter of course to employ an area sensor structure such that color filters for decomposition into three colors are formed on respective sensors of CCDs. Among these area sensors, at the area sensor 410, near-infrared ray transmission filters (R/B) are formed in a suitable ratio of, e.g., four to one (in the 4:1 ratio). As previously described, the near-infrared ray transmission filter may be formed in such a manner that red filter (R) and blue filter (B) overlap with each other. An arrangement of sensor structure provided with such near-infrared transmission filters is shown in FIG. 11.

Figure 11:
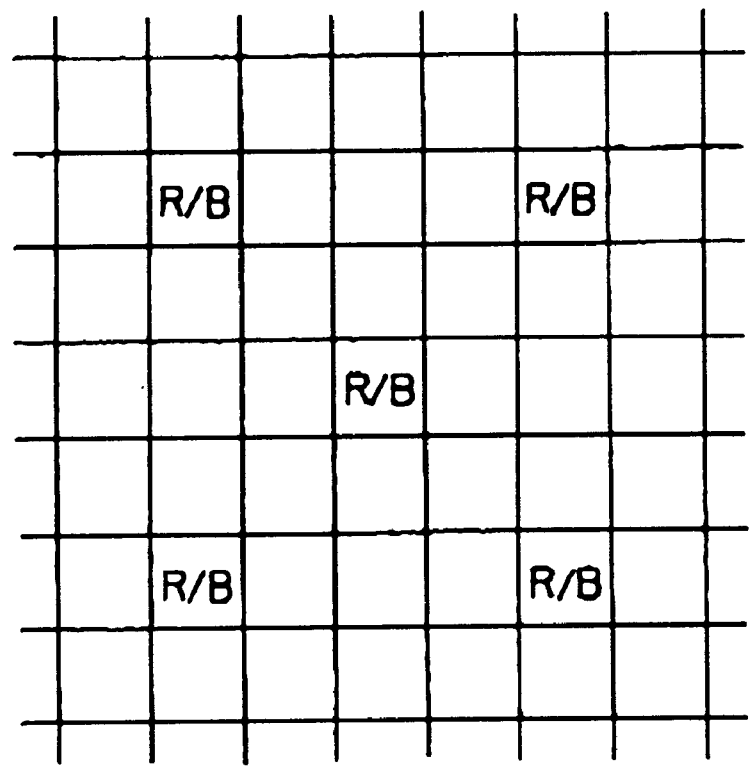
FIG. 11 is an explanatory view showing an example of arrangement of sensors for reading light in the near-infrared region formed in CCD for red in the three element type area image sensor.

It is to be noted that in the case where the three color decomposition is not carried out by prism, red filters are formed at the pixels indicated as blank in FIG. 11. In addition, in order to improve the resolution, in the area sensor, infrared ray cut filters may be suitably disposed (overlaid) except for the near-infrared sensor portions.

Such configuration of the three sensor (elements) type CCD can also read concealed information recorded in the near-infrared region while maintaining the picture quality equivalent to the conventional level.

The solid-state image sensing devices in the above-described respective embodiments are not limited to CCD, but may be solid-state image sensing devices of other systems.

What is claimed is:

1. An image sensor comprising:
   a light source for irradiating light onto a manuscript to be read partially including an area from which near-infrared rays are emitted;
   an optical system for converging a reflected light obtained as the result of the fact that the light irradiated from the light source is reflected on the surface of the manuscript;
   a scanning system for carrying out relative movement between the optical system and the manuscript; and
   a solid state image sensing device adapted for receiving the reflected light converged by the optical system,
   the solid state image sensing device including
   first to fourth pixel sensors formed in a parallel row form on a semiconductor substrate surface portion and adapted for producing signals corresponding to quantities of received rays of light,
   color filters of red, green and blue respectively formed on the rows of the first to third pixel sensors,
   an infrared ray cut filter for commonly covering the color filters of red, green and blue, and
   a near-infrared ray transmission filter comprised of a stacked body of the color filters of red and blue formed on the row of the fourth pixel sensor.

2. An image sensor as set forth in claim 1,
   wherein the color filters of red and blue formed on the rows of the first to third pixel sensors and the color filter of red and blue formed on the row of the fourth pixel sensor are formed by the same process.

3. An image sensor as set forth in claim 1, wherein the scanning system is of a form such that the manuscript is fixed and the light source and the optical system are movable.

4. An image sensor as set forth in claim 1, wherein the scanning system is of a form such that the light source and the optical system are fixed and the manuscript is movable.

5. An image sensor as set forth in claim 1, wherein said image sensing device further comprises a light shielding film formed on the semiconductor substrate while having opening portions corresponding to the first to fourth pixel sensors.

6. An image sensor as set forth in claim 1, wherein said color filters are comprised of dye film of casein or gelatin.

7. An image sensor comprising:

a light source for irradiating light onto a manuscript to be read at least partially including an area from which near-infrared rays are emitted;

an optical system for converging a reflected light obtained as the result of the fact that the light irradiated from the light source is reflected on the surface of the manuscript; and a solid state image sensing device adapted for receiving the reflected light converged by the optical system, the solid state image sensing device including plural pixel sensors formed in a matrix form on a semiconductor substrate surface portion and adapted for producing signals corresponding to quantities of received rays of light, and near-infrared ray transmission filters each comprised of a stacked body of color filters of red and blue, which are formed on specific ones of the plural pixel sensors disposed in a distributed manner in accordance with a predetermined rule among the plural pixel sensors.

8. An image sensor as set forth in claim 7, wherein said image sensing device further comprises a light shielding film formed on the semiconductor substrate while having opening portions corresponding to the plural pixel sensors.

9. An image sensor as set forth in claim 7, wherein said color filters are comprised of dye film of casein or gelatin.

10. An image sensor as set forth in claim 7, which further comprises color filters formed on the pixel sensors except for the specific pixel sensors.

11. An image sensor as set forth in claim 10, wherein the color filters are three primary color filters of red, green and blue.

12. An image sensor as set forth in claim 10, wherein the color filters are color filters of the complementary color system.

13. An image sensor as set forth in claim 10, which further comprises an infrared ray cut filter formed on the color filters.

14. An image sensor comprising:

a light source for irradiating light onto a manuscript to be read partially including an area from which near-infrared rays are emitted;

an optical system for converging a reflected light obtained as the result of the fact that the light irradiated from the light source is reflected on the surface of the manuscript and for separating it into rays of light in first to third optical paths; and first to third solid-state image sensing devices respectively provided on the first to third optical paths, the first to third solid-state image sensing devices respectively including plural pixel sensors formed in a matrix form on a semiconductor substrate surface portion, and adapted for producing signals corresponding to quantities of received rays of light, at least one of the first to third solid-state image sensing devices including near-infrared ray transmission filters each comprised of a stacked body of color filters of red and blue formed on specific ones of the pixel sensors disposed in a distributed manner in accordance with a predetermined rule among the plural pixel sensors.

15. An image sensor as set forth in claim 14, wherein the first to third solid-state image sensing devices are respectively solid-state image sensing devices adapted for outputting a red signal, a green signal and a blue signal, the near-infrared ray transmission filters being formed on the specific pixel sensors in the solid-state image sensing device adapted for outputting the red signal.

16. An image sensor as set forth in claim 14, wherein said color filters are comprised of dye film of casein or gelatin.

17. An image sensor as set forth in claim 14, wherein said image sensing devices comprise color filters formed on the pixel sensors except for said specific sensors.

18. An image sensor as set forth in claim 14, wherein said image sensing device comprises an infra-red ray cut filter formed on said color filters.

* * * * *